(12) United States Patent
Tangirala (10) Patent No.: US 11,239,855 B2
(45) Date of Patent: Feb. 1, 2022

(54) LOW-NOISE DIFFERENTIAL-OUTPUT CAPACITOR DAC

(71) Applicant: Rambus Inc., San Jose, CA (US)

(72) Inventor: Shankar Tangirala, Fremont, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/166,919

(22) Filed: Feb. 3, 2021

(65) Prior Publication Data

US 2021/0250038 A1    Aug. 12, 2021

Related U.S. Application Data

(60) Provisional application No. 62/975,099, filed on Feb. 11, 2020.

(51) Int. Cl.
| | |
|---|---|
| *H03M 1/44* | (2006.01) |
| *H03M 1/80* | (2006.01) |
| *H03M 1/68* | (2006.01) |
| *H03M 1/36* | (2006.01) |
| *H03M 1/14* | (2006.01) |

(52) U.S. Cl.
CPC ............ *H03M 1/442* (2013.01); *H03M 1/68* (2013.01); *H03M 1/802* (2013.01); *H03M 1/145* (2013.01); *H03M 1/361* (2013.01)

(58) Field of Classification Search
CPC ........ H03M 1/442; H03M 1/802; H03M 1/68; H03M 1/361; H03M 1/145
USPC .......................... 341/144, 150, 155–156, 161
See application file for complete search history.

(56) References Cited

U.S. PATENT DOCUMENTS

| | | | |
|---|---|---|---|
| 7,215,274 B2 * | 5/2007 | Liu ......................... | H03M 1/42 341/122 |
| 8,199,041 B2 * | 6/2012 | Nakajima ........... | H03M 1/1004 341/156 |

* cited by examiner

*Primary Examiner* — Khai M Nguyen
(74) *Attorney, Agent, or Firm* — Charles Shemwell (57) ABSTRACT

A capacitor-based digital-to-analog-converter produces a level-shifted analog outputs by precharging respective sets of output-generating capacitors to different applied potentials and then floating a common output of the sets of capacitors such that charge is redistributed among the capacitors through the common output to yield, across all the capacitors, a uniform precharge voltage that falls between the different applied potentials.

20 Claims, 3 Drawing Sheets

LOW-NOISE DIFFERENTIAL-OUTPUT CAPACITOR DAC

CROSS REFERENCE TO RELATED APPLICATIONS

This application hereby incorporates by reference and claims priority to U.S. provisional application No. 62/975,099 filed Feb. 11, 2020.

DRAWINGS

The various embodiments disclosed herein are illustrated by way of example, and not by way of limitation, in the figures of the accompanying drawings and in which like reference numerals refer to similar elements and in which.

DETAILED DESCRIPTION

In various embodiments disclosed herein, capacitor-based digital-to-analog-converters (DACs) produce level-shifted analog outputs by precharging respective sets of output-generating capacitors to different potentials and then floating the common output of the two sets of capacitors such that charge is redistributed through the common output to yield, across all the capacitors, a uniform precharge voltage that falls between the different applied potentials. In a number of embodiments, the analog DAC outputs are level shifted by 50% (half) of a reference voltage (Vref) that sets the scale (difference between minimum and maximum) of the analog output swing by pre-charging half of the output-generating capacitors to Vref and the other half to 0 v (or ground) and then allowing the outputs of those capacitors to float in common such that the resulting charge redistribution will balance the precharge voltage on all the output-generating capacitors at Vref/2 (i.e., 0.5 Vref). By this arrangement, referred to herein as split-voltage precharging or split-precharge, the operational overhead (time), circuitry and switching noise (kTC) otherwise required/incurred for explicit generation and sampling of the mid-scale voltage (i.e., precharging all the output-generating capacitors to Vref/2 relative to a baseline potential by sampling an explicitly generated 0.5 Vref reference voltage at the capacitor inputs while the capacitor outputs are coupled to the baseline voltage source) is avoided, yielding a lower-noise, smaller-footprint DAC with increased timing margin.

Figure 1:
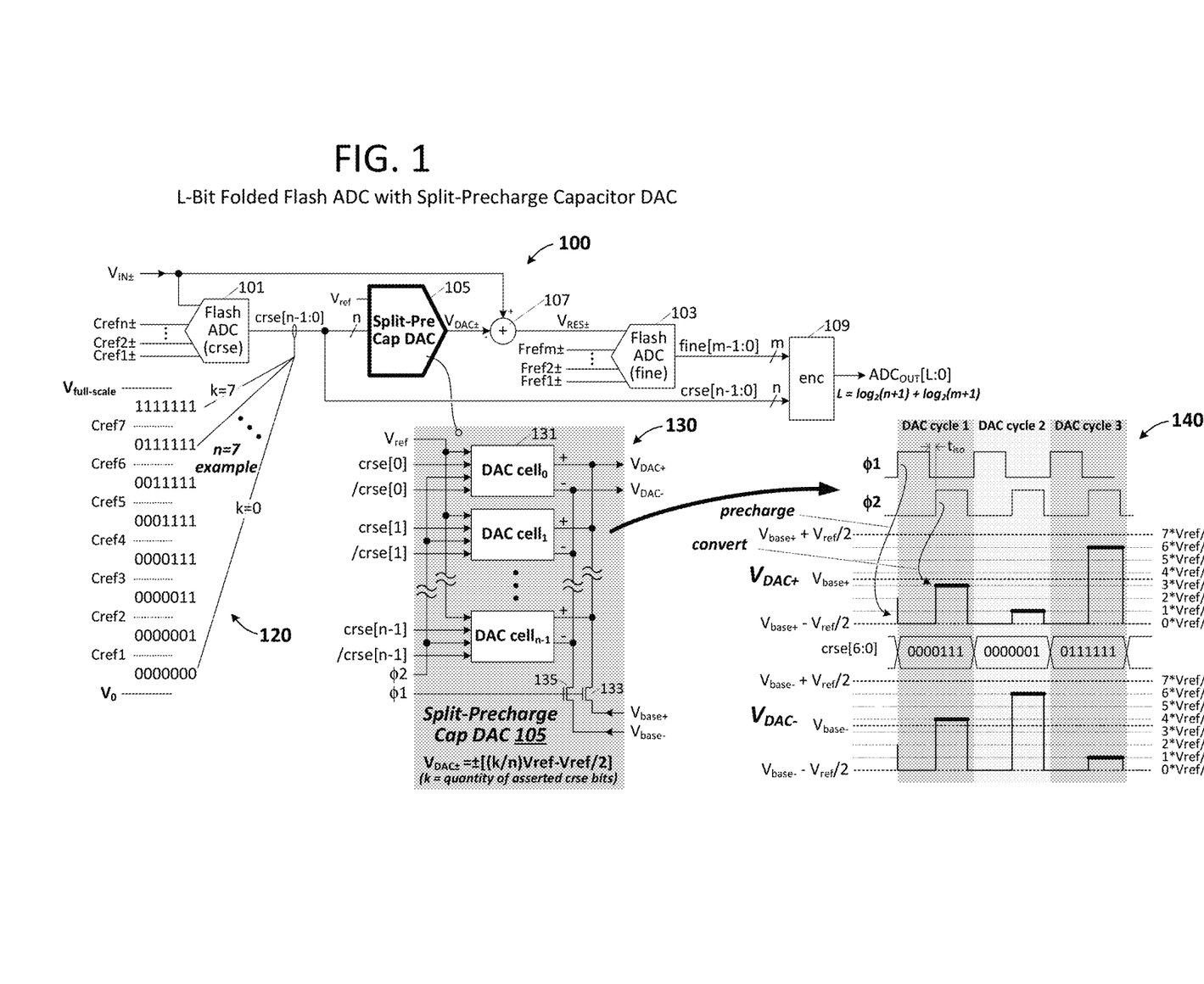
FIG. 1 illustrates an embodiment of a folded flash analog-to-digital converter (ADC) having coarse and fine flash ADC stages together with a split-precharge capacitor DAC (digital-to-analog converter)

FIG. 1 illustrates an exemplary L-bit folded flash analog-to-digital converter (ADC) 100 having coarse and fine flash ADCs (101, 103) together with a split-precharge capacitor DAC 105—an application in which the half-scale shift effected by split-precharge capacitor DAC 105 yields an output scaled by a supplied reference voltage (Vref) and that swings above and below a baseline voltage by Vref/2. More specifically, in the differential embodiment shown, the split-precharge capacitor DAC ("cap DAC") output includes true and complement components ($V_{DAC+}$, $V_{DAC-}$) in which the true component swings through (i.e., may have any of a number of discrete potentials within) a Vref range centered at a first baseline voltage ($V_{base+}$) and thus from $V_{base+}$−Vref/2 to $V_{base+}$+Vref/2, while the complement component swings in the complement direction through a Vref range centered at a second baseline voltage ($V_{base-}$) and thus from $V_{base-}$+Vref/2 to $V_{base-}$−Vref/2.

Still referring to FIG. 1, coarse flash ADC 101 digitizes (quantizes) an analog input voltage ($V_{IN}$) into an n-bit "coarse" digital output (crse[n−1:0]) indicating which of n+1 voltage intervals spans the analog input (i.e., in which voltage interval the analog input falls). In the example shown at 120, for instance, a seven bit coarse ADC output (crse[6:0]) divides the valid range of the analog input ($V_0$ to $V_{full-scale}$) into eight voltage intervals numbered from 0 to 7 according the number of asserted bits in the coarse ADC output. In one embodiment, coarse flash ADC 101 simultaneously compares (or compares in a single compare-clock cycle) the incoming analog signal ($V_{IN}$) against n "coarse" reference voltages (Cref1-Crefn, where n=7 in the detail at 120), setting a respective bit within the coarse ADC output for each exceeded reference voltage. The input voltage and reference voltages supplied to flash ADC 101 (and optionally the digital output of flash ADC 101, crse[n−1:0]) are differential in the depicted embodiment (i.e., having true and complement components at opposite-polarity voltage offsets from a voltage midpoint between $V_0$ and $V_{full-scale}$).

Split-precharge capacitor DAC 105 generates the half-scale shifted analog output ($V_{DAC\pm}$) in accordance with the coarse ADC output (crse[n−1:0]), with the DAC output, in turn, being subtracted from the analog input in arithmetic circuit 107 to yield a residual voltage, $V_{RES\pm}$—effectively the difference between the analog input $V_{IN\pm}$ and the nearest lesser one of n+1 possible DAC output voltages—that is supplied to fine flash ADC 103 for conversion into an m-bit digital output (fine[m−1:0]). The m-bit fine flash ADC output (which is generated generally in the same manner as the coarse flash ADC output, but according to comparison with 'm' fine reference voltages, Fref1, Fref2, . . . , Frefm) is supplied, together with the n-bit coarse flash ADC output, to an encoder block 109 that generates an L-bit binary ADC output (i.e., quantizing the analog input, $V_{IN}$, into a digital numeric value corresponding to one of $2^L$ possible analog voltage levels), where L=$\log_2$(m+1)+$\log_2$(n+1).

In one embodiment, shown in detail view 130 of FIG. 1, split-precharge cap DAC 105 is implemented by a number of DAC cells 131 (i.e., 'n' DAC cells according to the bit-depth, 'n' of the coarse ADC output) each having commonly coupled differential outputs. That is, the true output of each DAC cell 131 ('+') is coupled to the true outputs of all the other DAC cells to form true DAC output $V_{DAC+}$, and the complement output of each DAC cell 131 ('−') is coupled to the complement outputs of all the other DAC cells to form complement DAC output $V_{DAC-}$. A pair of control signals φ1 and φ2 (which, as discussed below, may be implemented by complementary instances of the same signal) are supplied to gates of output-isolation transistors 133 and 135 and to DAC cells 131, respectively, to trigger precharge and convert phases of each digital-to-analog conversion within the split-precharge cap DAC (i.e., φ1 and φ2 both cycling once per DAC output generation to define a DAC cycle). More specifically, φ1 is asserted during the precharge phase to switch on transistors 133 and 135 (i.e., switch those transistors to a conducting state) and thus couple the true and complement outputs of each DAC cell to baseline voltages $V_{base+}$ and $V_{base-}$, respectively, while φ2 is deasserted. As explained in further detail below, DAC cells 131 respond to the deasserted state of φ2 by coupling input nodes of output-generating capacitors ("output caps") within the DAC cells to different precharge potentials that average to Vref/2 while the output nodes of those capacitors are coupled to the baseline voltage source by virtue of φ1 assertion (i.e., switching on and thus deactivating isolation transistors 133 and 135). More specifically, by driving the input nodes of half of the output-generating capacitors coupled to the true DAC output ($V_{DAC+}$) to Vref during φ1 assertion and grounding the input nodes of the other half of the output-generating capacitors coupled to $V_{DAC+}$, half of the capacitors are precharged to $V_{base+}$–Vref while the other half are precharged to $V_{base+}$–0 v (ground in this example) and then switching off transistor 133 (i.e., deasserting φ1 to conclude the precharge operation), the interconnected DAC cell outputs will result in charge redistribution among the output-generating capacitors to yield, as an equilibrium point, a $V_{base+}$–Vref/2 precharge on all output capacitors coupled to the true DAC output. The same precharge is effected within the collective set of capacitors having outputs coupled in common to the complement DAC output-precharging half to $V_{base-}$–Vref and the other half to $V_{base-}$–0 v to yield, upon φ1 deassertion (and thus switching-off of isolation transistor 135), a $V_{base-}$–Vref/2 precharge on all output-generating capacitors coupled to the complement DAC output. Thereafter, when φ2 is asserted, input nodes of the output-generating capacitors coupled to $V_{DAC+}$ are driven to either Vref or Gnd according states of respective bits within the incoming ADC value (crse[n–1:0]) to effect an output voltage having one of n+1 levels relative to the precharge potential ($V_{base+}$–$V_{ref}$/2). That is, $V_{DAC+}$=($V_{base+}$–Vref/2)+k*Vref/n=$V_{base+}$+(kVref/n–Vref/2), where k=0, 1, 2, . . . , n–1, n according to the number of asserted bits within the crse[n–1:0] value). The complement DAC output is similarly driven to one of n+1 levels relative to the complement precharge potential ($V_{base-}$–Vref/2) according to the number of deasserted bits (or asserted complement bits) within the incoming ADC value (i.e., n–k; the number of bits asserted in /crse[n–1:0]) to produce $V_{DAC-}$=($V_{base-}$–Vref/2)+(n–k)*Vref/n=$V_{base-}$–Vref/2+Vref–k*Vref/n=$V_{base-}$+Vref/2–k*Vref/n=$V_{vase-}$–(kVref/n–Vref/2). Assuming for purposes of example that $V_{base+}$=0 v (ground), then $V_{DAC\pm}$=±(kVref/n–Vref/2).

Still referring to FIG. 1, the waveforms at 140 illustrate exemplary signal levels on the split-precharge cap DAC outputs ($V_{DAC+}$ and $V_{DAC-}$) for a sequence of coarse ADC values supplied in successive DAC cycles. In the depicted example, the coarse ADC output is a seven bit value, in which 'k' (the number of asserted bits) is three (0000111), one (0000001) and six (0111111) for the three DAC output cycles shown. During the precharge phase of each DAC cycle (i.e., while φ1 asserted and φ2 is deasserted), the true and complement DAC outputs are driven to their respective baselines minus Vref/2 (the "precharge voltage" in this case effecting a half-scale shift) and, during a subsequent convert phase of each DAC cycle (while φ2 asserted and φdeasserted), the DAC outputs are driven to one of n+1 voltage levels offset from their respective precharge voltages by k*Vref/n (n=7 in the example shown) for $V_{DAC+}$ and (n–k)*Vref/n for $V_{DAC-}$, where 'k' is the number of bits asserted in the coarse ADC output and 'n–k' is the number of deasserted bits (or the number of asserted complement bits) in the coarse ADC output. To avoid inadvertent loss of precharge, an isolation interval ($t_{iso}$) or isolation phase may be enforced between the precharge and convert phases of each DAC cycle by lowering φ1 at least $t_{iso}$ before raising φ2.

Figure 2:
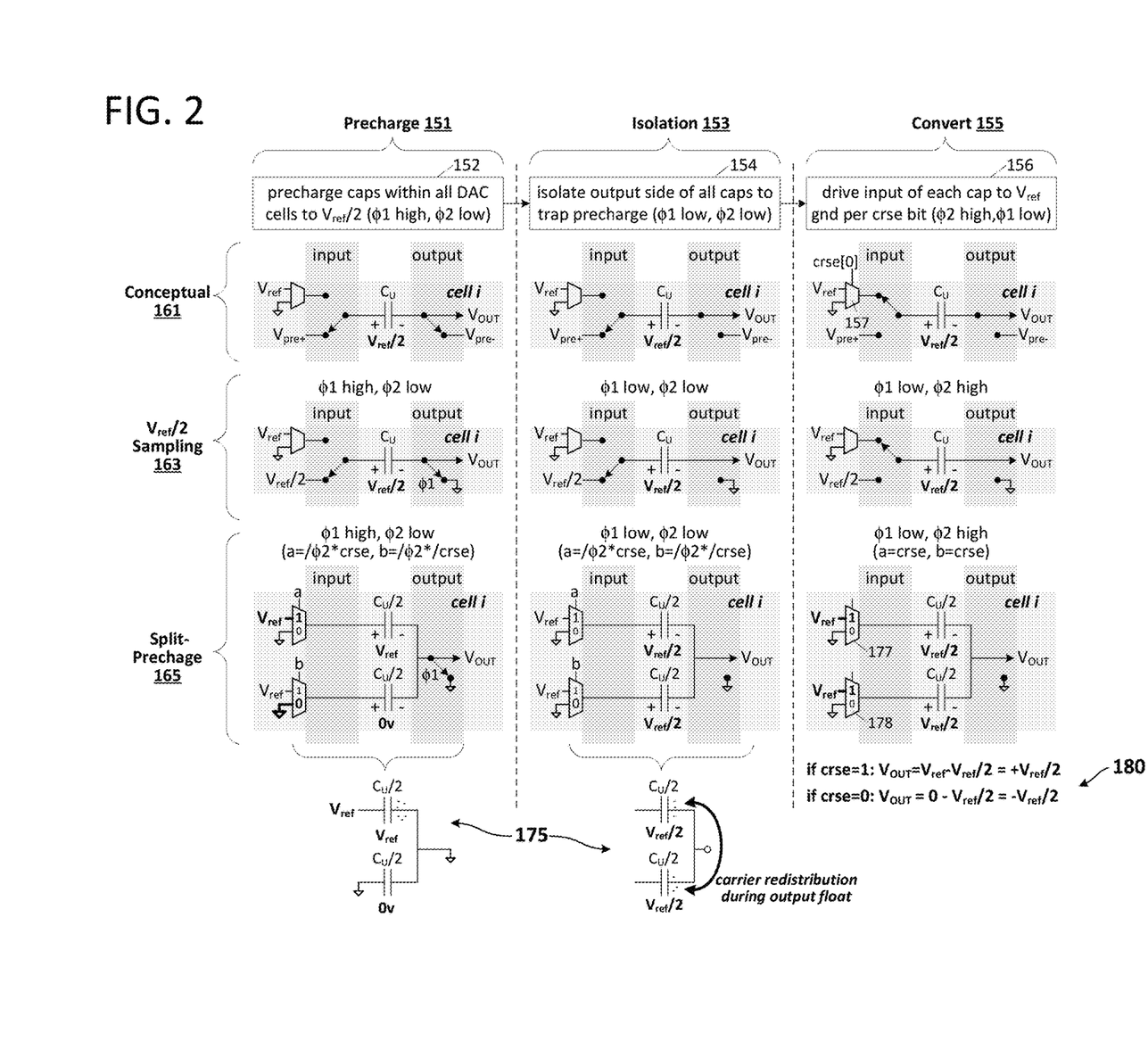
FIG. 2 illustrates exemplary precharge, isolation and convert phases of a DAC cycle within conceptual, reference-sampling and split-precharge DAC cell implementations.

FIG. 2 illustrates precharge (151), isolation (153) and convert phases (155) of a DAC cycle within an exemplary DAC cell ("cell[i]"), depicting implementations of the those operations left-to-right in a conceptual DAC cell implementation (161), in a Vref/2 sampling DAC cell 163, and in a split-precharging DAC cell implementation (165). In the precharge phase the output-generating capacitors within all cells of the cap DAC are precharged to Vref/2, by raising φ1 while φ2 is low (i.e., as shown at 152). Conceptually this operation is effected by applying a precharge voltage ($V_{pre+}$–$V_{pre-}$) across all output-generating capacitors (i.e., "unit capacitors," $C_U$)—that is, coupling $V_{pre+}$ to the $C_U$ input nodes and coupling $V_{pre-}$ to the $C_U$ output nodes. Staying with the conceptual operation (161), during the ensuing isolation interval (φ1=low, φ2=low as shown at 154), the $C_U$ output nodes are decoupled from the precharge potential, thus trapping the precharge voltage (in this case assumed to be Vref/2 to effect a half-scale shift) on each capacitor. By this operation, the input nodes of the capacitors may be selectively driven to either Vref or Ground during the subsequent convert phase (i.e., driven to Vref or 0 v according to crse bits while φ2 is high and φ1 is low—an operation effected by multiplexer 157), to drive the common output nodes of the output-generating capacitors to a potential equal to the number of asserted crse bits (k) divided by the total number of crse bits (n) as discussed above minus the pre-loaded (precharged) Vref/2 voltage and thus kVref/n–Vref/2.

Still referring to FIG. 2, in the half-scale sampling implementation (i.e., Vref/2 sampling) at 163, the Vref/2 precharge is effected by coupling the input nodes of all output-generating capacitors to an explicitly generated mid-scale reference voltage, Vref/2 during the precharge phase (in this Vref/2 precharge example, the output nodes are switchably coupled to ground in response to the φ1 assertion). The ensuing isolation and convert operations are carried out as in the conceptual example—floating/releasing the capacitor output nodes from the output precharge potential (ground in this example) to trap the Vref/2 precharge during isolation phase 153 and then driving the input nodes of the unit capacitors according to crse bit states during convert phase 155.

In the split-precharge example shown at 165, the unit capacitors ($C_U$) within each DAC cell are split into two half-unit capacitors (i.e., each having capacitance $C_U$/2) and precharged to opposite Vref and 0 v potentials relative to the output node precharge voltage (ground in this example). By this operation, which requires no explicit generation or sampling of the half-scale voltage (avoiding the additional circuit area and per-cell kTC noise that would otherwise be incurred—noise doubled by requirement for Vref/2 sampling in both the true and complement components of each DAC cell), a charge redistribution occurs during the ensuing isolation interval (i.e., output nodes of all half-unit capacitors isolated/floating) to yield a balanced precharge on each pair of output-coupled half-unit capacitors and thus the desired Vref/2 precharge state on the overall DAC output. This carrier redistribution is shown at 175, with an initial carrier imbalance effected during the precharge interval (151) shifting to the Vref/2 equilibrium during the isolation interval (153). During the convert phase within the split-precharge DAC cell implementation, each of the half-unit capacitors within a given DAC cell is driven to the same potential (Vref or Gnd—via multiplexers 177, 178) to yield, in a conceptually isolated cell, an output ($V_{OUT}$) at either Vref−Vref/2=+Vref/2 or 0−Vref/2=−Vref/2 relative to the voltage applied to the output node during precharge and thus an output exhibiting the desired half-scale shift as shown at 180.

Figure 3:
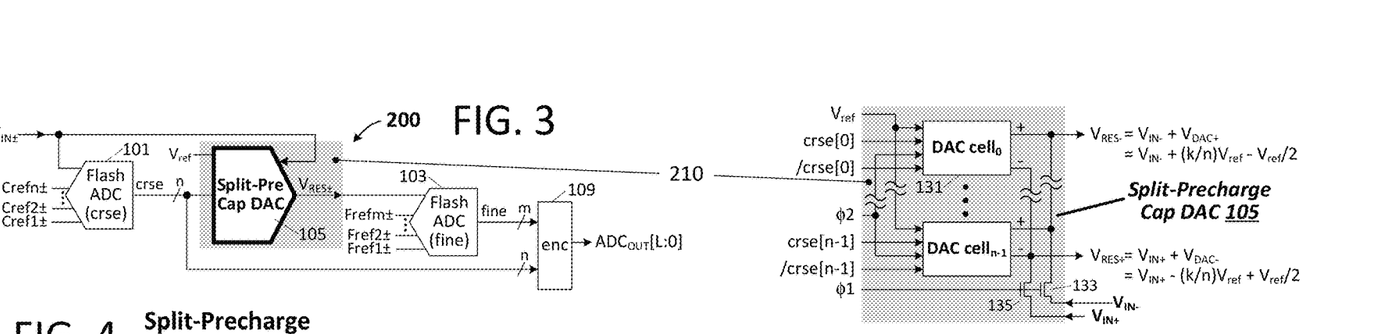
FIG. 3 illustrates an embodiment of a folded flash ADC having the coarse and fine flash ADC stages together with a split-precharge capacitor DAC that generates an analog output referenced to the analog signal converted by the coarse ADC stage.

Referring again to FIG. 1 and noting that the split-precharge cap DAC outputs $V_{DAC+}$ and $V_{DAC−}$ are generated relative to baseline voltages $V_{base+}$ and $V_{base−}$, it follows that the differencing operation implemented by arithmetic circuit 107 (i.e., subtracting the DAC output from the original analog input to yield residual voltage, $V_{RES\pm}$) may be effected by the split-precharge DAC itself by supplying $V_{IN+}$ and $V_{IN−}$ as the output node precharge voltages, $V_{base−}$ and $V_{base+}$, respectively. This arrangement is shown in FIG. 3. That is, arithmetic circuit 107 is omitted from the folded flash ADC embodiment shown at 200, with the analog input being supplied to the output nodes of the split-precharge capacitor DAC via isolation transistors 133 and 135 (see detail view 210). By this arrangement the true DAC output is added to the complement analog input (VIN−) to produce VRES− and the complement DAC output is added to the true analog input (VIN+) to produce VRES+; a differential subtraction in which $V_{TES+}=V_{IN+}−(kVref/n−Vref/2)$ and $V_{RES−}=V_{IN−}+(kVref/n−Vref/2)$.

Figure 4:
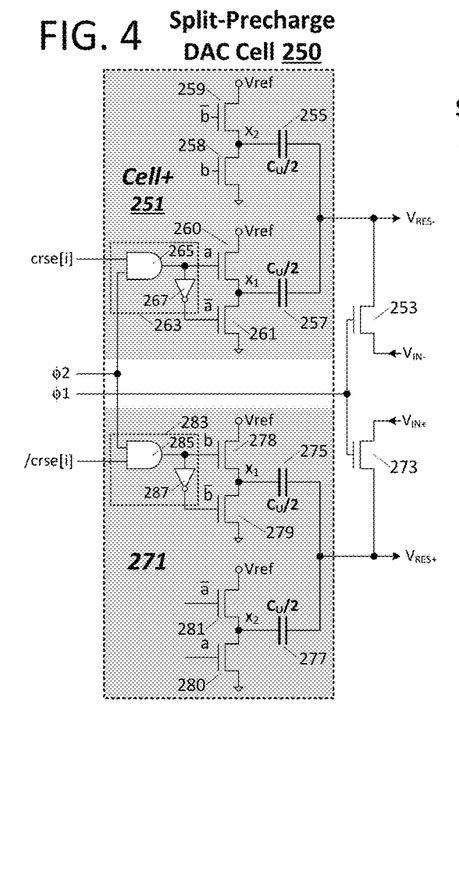
FIG. 4 illustrates an embodiment of a split precharge DAC cell that may be used to implement DAC cells within the split-precharge capacitor DACs of FIGS. 1 and 3 and the split-precharge DAC cells shown in FIG. 2.

FIG. 4 illustrates an embodiment of a split precharge DAC cell 250 that may be used to implement DAC cells within the split-precharge cap DACs shown in FIGS. 1 and 3 and the split-precharge DAC cells shown in FIG. 2. In the depicted example, true and complement components of the DAC cell (251, 271) drive respective outputs coupled via isolation transistors 253 and 273 to opposite-polarity components of the analog input voltage, $V_{IN−}$ and $V_{IN+}$. Each cell component 251, 252 includes a pair of half-sized capacitors "$C_U/2$" (255/257 in true cell component, "cell+", and 275/277 in complement cell component, "cell−") having output nodes coupled in common to the drain of an isolation transistor (253 for cell+, 273 for cell−) and input nodes coupled at the common drains of transistors coupled in series between Vref and ground (i.e., to the common drains of transistors 258/259 and 260/261 in cell+, and to the common drains of transistors 278/279 an 280/281 in cell−). Logic circuits 263 and 283 produce control signals a and b (and their complements /a and /b) for application to the gates of the drive-side transistors within each cell component (i.e., transistors 258-261 in cell+ and transistors 278-281 in cell−). More specifically, ϕ2 is logically ANDed with the incoming coarse ADC bit (crse[i]) within gate 265 of logic circuit 263 to produce control 'a' and (via inverter 267) '/a' which are supplied to gates of respective transistors 260 and 261 within true cell component 251 and to the gates of respective transistors 280 and 281 within complement cell component 271. In logic circuit 283, <ϕ2 is logically ANDed (285) with the complement ADC bit (/crse[i]) to produce control signal 'b' and (via inverter 287) '/b' which are supplied to gates of respective transistors 258 and 259 within cell+ and to gates of respective transistors 278 and 279 within cell−. By this arrangement, when ϕ2 is low and ϕ1 is high (during precharge), control signals 'a' and 'b' are driven low and their complements driven high, thus switching on transistors 259 and 261 within true cell component 251 to precharge the two half-capacitors to ground and Vref, respectively, relative to baseline voltage $V_{IN−}$. That is, while ϕ1 is high (switching isolation transistor 253 to a conducting state), half-capacitor 257 is precharged to $V_{IN−}$−0 v (ground) and half-capacitor 255 is precharged to $V_{IN−}$−Vref. Transistors 279 and 281 are similarly switched on during precharge to precharge half-capacitors 275 and 277 to ground and Vref, respectively, relative to baseline voltage $V_{IN+}$ (i.e., while isolation transistor 273 switched to conducting state in response to ϕ1 assertion). During the ensuing isolation interval (i.e., ϕ1 lowered before ϕ2 raised to inadvertent avoid loss of precharge), the floating (and interconnected) output nodes of the half-capacitors within each of the true and complement cell components results in a charge redistribution to yield the desired −Vref/2 precharge (relative to respective baseline voltages, $V_{IN−}$ and $V_{IN+}$) on the output-generating capacitors within each cell component. When ϕ2 is asserted (during the subsequent convert phase), the 'a' and 'b' signals are driven to opposite states according to the crse bit so that both 'a' and '/b' will be high (if crse is high) to drive Vref at the input nodes of both half-capacitors (255/257) within true cell component 251 and to drive the ground potential at the input nodes of both half-capacitors (275/277) within complement cell component 271, thus yielding a differential residual voltage output in which $V_{RES−}=V_{IN−}+$Vref−Vref/2=$V_{IN−}+$Vref/2, and $V_{RES+}=V_{IN+}$−Vref/2−0=$V_{IN+}$−Vref/22 (i.e. assuming for purposes of example that DAC cell 250 alone drives the residual voltage output). The opposite output is produced ($V_{RES−}=V_{IN−}$−Vref/2, $V_{RES+}=V_{IN+}+$Vref/2) if crse[i] is low.

In one embodiment, FIG. 4 logic circuits 263 and 283 each drive gates of two pairs of transistors—gates of one transistor pair in true cell 251 and gates of another transistor pair in complement cell 271. In other embodiments, a replica instance of logic circuit 263 may be provided within complement cell 271 and a replica instance of logic circuit 283 may be provided within true cell component 251 so that each individual logic circuit controls only one pair of transistors (i.e., where the true and complement cell components are physically displaced with, for example, all true components of DAC cells collocated in one physical half of split-precharge capacitor DAC and all complement components collocated in other physical half of split-precharge capacitor DAC). In yet other embodiments, different logic circuit implementations may be provided to yield generally the same effect—coupling the input nodes of the half-capacitors within each cell component (255/257 and 275/277) to opposite Vref and Ground potentials during precharge (ϕ1 high, ϕ2 low) and then coupling the input nodes within each cell component to the same potential (Vref or Gnd) during the convert phase of the DAC cycle, with the true cell component input-node potential being opposite in polarity to the complement cell component input-node potential.

Figure 5:
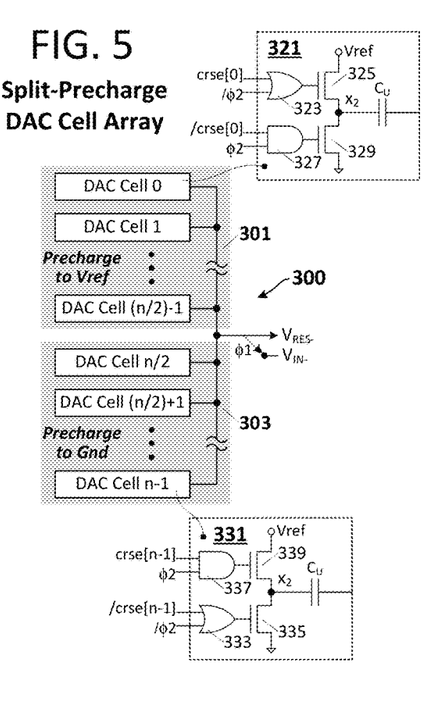
FIG. 5 illustrates an embodiment of a split-precharge DAC cell array in which precharge splitting is effected across the cell array rather than within individual split-capacitor DAC cells as in FIG. 4.

Referring briefly to the split-precharge implementation shown at 165 in FIG. 2 and noting that charge redistribution is effected by precharging equal numbers of half-unit capacitors to ground and Vref (i.e., charging half of the $C_U/2$ capacitors to ground and the other half to Vref), it follows that an equivalent charge-splitting operation may be effected within any DAC embodiment having an even number of capacitors regardless of capacitor size ($C_U$ or $C_U/2$ or other) and location. For example, a half-scale shift may be achieved within a capacitor DAC having an even number of DAC cells by precharging the unit capacitors within half of the DAC cells to Vref and precharging the unit capacitors within the other half of the DAC cells to ground (i.e., relative to baseline voltages in both instances) and then releasing the common output nodes of all the DAC cells during isolation to enable charge redistribution to the Vref/2 equilibrium. FIG. 5 illustrates an example of such a split-precharge DAC cell array (i.e., precharge splitting effected across the cell array rather than within individual DAC cells as in FIG. 4) in which unit capacitors ($C_U$) within half of the DAC cells (DAC cell 0, DAC cell 1, . . . DAC cell (n/2)−1, constituting subset 301) are precharged to Vref (relative to a baseline potential) and unit capacitors within the other half of the DAC cells (cell n/2, cell (n/2)+1, . . . , cell n−1, constituting subset 303) are precharged to ground. Thereafter, when φ1 is deasserted (isolating the cap-DAC output from the baseline shown to be $V_{IN-}$ in this example), charge is redistributed between the unit capacitors of the two DAC cell subsets (halves 301, 303)—an array-wide inter-cell charge redistribution rather than intra-cell redistribution between half-unit capacitors—to produce the desired half-scale shift (i.e., precharging to Vref/2 relative to baseline potential). Exemplary logic circuit implementations within the two DAC cell subsets (precharge to Vref in subset 301 and precharge to ground in subset 303) are shown at 321 and 323. In the Vref precharge cell subset 301 (each having configuration 321), OR gate 323 drives the gate of transistor 325 high during precharge (while φ2 is low) to couple the input node of a unit capacitor ($C_U$) to Vref. OR gate 335 within the ground-precharge cell subset 303 performs a counterpart operation, driving the gate of transistor 339 high during precharge to couple the input node of unit capacitor $C_U$ to ground. During the convert phase while, φ2 is high and φ1 is low, the input node of each unit capacitor is coupled to Vref or ground (i.e., via gates/transistors 323/325 or 327/329, respectively, in logic circuit 321 and via gates/transistors 337/339 or 333/335, respectively in logic circuit 331) according to the state of the incoming coarse ADC bit.

Still referring to FIG. 5, the individual DAC cells that constitute the Vref-precharge and Ground-precharge subsets need not be physically collocated nor coupled to specific subsets of bits within the coarse ADC value. For example, rather than splitting the two DAC cell subsets between physically distinct regions (halves) of the cell array or between subsets coupled to an upper half and lower half of the coarse ADC value (i.e., MSBs coupled to one subset LSBs to the other), each adjacent pair of DAC cells (in terms of physical location and/or coarse ADC bit value) may be precharged respectively to ground and Vref. Further, in embodiments having an odd number of output-generating capacitors (and for which a half-scale shift is desired), an additional capacitor may be coupled to the cell output during the precharge and isolation phases (i.e., to even the capacitor count and thus enable a 50/50 split precharge) and then switched out of circuit prior to the convert phase of each DAC cycle. Further, the two DAC cell subsets may be constituted by different numbers of DAC cells to achieve precharge values other than half-scale (Vref/2). For example, a quarter-scale shift may be achieved by precharging one quarter of the DAC cells to one potential (Vref or Ground) and the remaining three-quarters of DAC cells to the alternate potential. Also, where individual DAC cells have binary weighted capacitances (or otherwise do not have identical capacitances), the number of DAC cells included within each subset may be skewed to yield a desired precharge voltage upon charge redistribution. Lastly, the DAC cell array shown in FIG. 5 may constitute the true component of a split-precharge capacitor DAC having both true and complement sets of DAC cells, each set split in two (or other numbers as discussed) to effect a desired split precharge and each set generating an output that complements the other (i.e., connections of crse and /crse swapped within each of logic circuits 321 and 323 within the complement set of DAC cells).

Observing that control signals φ1 and φ2 have a deterministic relationship in the embodiments described above, it follows that either signal may be synthesized from the other. In one embodiment, for example, the φ1 control signal alone is supplied to a split-precharge capacitor DAC (in any of the above-described embodiments) and then propagated through some number of gates (e.g., one or more inverter stages) to produce, as control signal φ2, a delayed and complementary instance of φ1. The number of inverter stages (or other gates) through which φ1 propagates (to yield φ2) may be selected to meet a specified isolation interval ($t_{iso}$) or otherwise prevent loss of precharge across all process/voltage/temperature corners. Simultaneous assertion of φ1 and φ2 (i.e., both briefly high) at the start of the isolation phase is (or may be) inconsequential.

Figure 6:
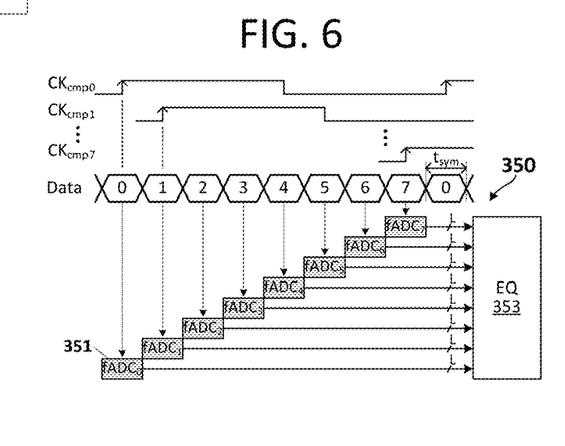
FIG. 6 illustrates an exemplary equalizing signal receiver in which folded flash ADCs having split-precharge DACs according to embodiments presented in FIGS. 1-5 may be deployed.

FIG. 6 illustrates an exemplary equalizing signal receiver 350 in which folded flash ADCs having split-precharge DACs according to embodiments presented above may be deployed. In the embodiment shown, a set of eight (8) flash ADCs 351 are triggered in round-robin fashion by respective phase-staggered comparator clocks ($CK_{cmp0}$–$CK_{cmp7}$) to produce respective N-bit ADC results for successive information-bearing symbols ("Data") conveyed on a single-ended or differential data link (i.e., each symbol falling within any one of two, four, eight, etc. voltage intervals to convey a single-bit, two-bit, three-bit, etc. data value). As shown, each of the comparator clocks cycles once per 8 data symbols thus expanding the time for individual flash ADC operation by a factor of 8 relative to the symbol rate—an approach that enables exceedingly fast symbol rates (e.g., on the order of 50, 20, or 10 picoseconds per symbol or less). The compare clock signals may themselves constitute the DAC control signals (i.e., φ1) discussed above and/or may be used to synthesize either or both of those DAC control signals (i.e., φ1 and φ2). Also, more or fewer flash ADCs may be provided or programmatically enabled to accommodate more or fewer temporally-parallel flash ADC operations in alternative embodiments and thus accommodate yet higher symbol rates (or reduce power consumption during lower speed signaling intervals). In one embodiment, for instance, sixteen flash ADCs 351 are provided to digitize sixteen successively received data symbols, with $t_{sym}$ equal to ~17 ps such that the compare clock cycle time is 16*17=272 picoseconds.

In the equalized embodiment of FIG. 6, the N-bit output of each flash ADC 351 is supplied to an equalizing circuit 353 which generates one or more equalization signals (not specifically shown) that are applied to downstream or feedback equalization circuitry. In the case of a decision-feedback equalizer, for example, the equalization signal or signals may adjust the level of the incoming data signal (i.e., analog voltage $V_{IN}$ supplied to flash ADCs 351) and/or may bias symbol-decision circuitry (e.g., influencing reference comparisons within flash ADCs 351 or elsewhere) to enable resolution of a symbol conveyed the incoming signal into one or more bits based in part on prior incoming symbols and/or signal levels. In one embodiment, one or more of the most-significant bits (MSBs) of the L-bit output from each flash ADC 351 is supplied to logic circuitry (not shown) as the recovered symbol value such that each of flash ADCs 351 (or any subset thereof) produces both equalization data and symbol resolution data. When receiver 350 is deployed within (or constitutes) a serializer/deserializer (SERDES) circuit, the respective symbol resolution components of the flash ADC outputs may be combined (parallelized) within an output register to provide an output word containing k*b/sym bits, where 'k' is the number of contributing flash ADCs 351 or flash ADC outputs (each flash ADC 351 may contribute one or more symbol resolution values, depending on whether the deserialization interval exceeds the comparator clock period) and 'b/sym' is the number of bits per conveyed symbol.

The various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the memory array (or subarray) sizes, matrix sizes, buffer sizes, bit-depths, number of neural-net layers, storage cell technologies, component circuits or devices and the like can be different from those described above in alternative embodiments. Additionally, links or other interconnection between integrated circuit devices or internal circuit elements or blocks may be shown as buses or as single signal lines. Each of the buses can alternatively be a single signal line (e.g., with digital or analog signals time-multiplexed thereon), and each of the single signal lines can alternatively be a bus. Signals and signaling links, however shown or described, can be single-ended or differential. Logic signals shown as having active-high assertion or "true" states, may have opposite assertion states in alternative implementations. Circuit functions implemented with PMOS transistors may be implemented instead with NMOS transistors (and vice-versa), with appropriate changes in transistor source connections (e.g., to opposite polarity voltage rails). A signal driving circuit is said to "output" a signal to a signal receiving circuit when the signal driving circuit asserts (or de-asserts, if explicitly stated or indicated by context) the signal on a signal line coupled between the signal driving and signal receiving circuits. The term "coupled" is used herein to express a direct connection as well as a connection through one or more intervening circuits or structures. Integrated circuit device "programming" can include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A digital-to-analog converter comprising:
capacitors having respective inputs and having outputs coupled in common to an output node; and
control circuitry to:
charge first and second subsets of the capacitors to respective first and second precharge voltages during a precharge interval by coupling the output node to a first voltage source, coupling the inputs of the capacitors of the first subset to a first reference voltage and coupling the inputs of the capacitors of the second subset to a second reference voltage;
decouple the output node from the first voltage source upon conclusion of the precharge interval; and
after decoupling the output node from the first voltage source, couple the inputs of the capacitors of the first and second subsets to either the first reference voltage or the second reference voltage according to bits of a digital input.

2. The digital-to-analog converter of claim 1 wherein the control circuitry to decouple the output node from the first voltage source comprises circuitry to float the output node to enable the first and second precharge voltages established across the capacitors of the first and second subsets to equalize at a third precharge voltage that falls between the first and second precharge voltages.

3. The digital-to-analog converter of claim 2 wherein respective quantities of the capacitors within the first and second subsets of the capacitors are constituted by equal quantities of the capacitors such that the third precharge voltage is the average of the first and second precharge voltages.

4. The digital-to-analog converter of 1 wherein the first voltage source is an analog voltage having an amplitude indicated by the digital input.

5. The digital-to-analog converter of claim 1 wherein the first voltage source is an analog signal that swings, over time, between maximum and minimum voltage levels and wherein the first reference voltage exceeds the maximum voltage level of the analog signal.

6. The digital-to-analog converter of claim 5 wherein a voltage difference between the maximum and minimum voltage levels of the analog signal substantially matches a voltage difference between the first and second reference voltages.

7. The digital-to-analog converter of claim 6 wherein the second reference voltage is a ground reference and wherein the maximum and minimum voltage levels of the analog signal are substantially equally offset from the ground reference in positive and negative polarities.

8. The digital-to-analog converter of claim 1 wherein the control circuitry to couple the inputs of the capacitors of the first and second subsets to either the first reference voltage or the second reference voltage according to bits of the digital input comprises circuitry to couple the inputs of each pair of the capacitors to either the first reference voltage or the second reference voltage according to a respective bit of the digital input.

9. The digital-to-analog converter of claim 1 wherein the digital input is constituted by an even number of bits equal in number to the total number of the capacitors having outputs coupled in common and wherein the control circuitry to couple the inputs of the capacitors of the first and second subsets to either the first reference voltage or the second reference voltage according to bits of the digital input comprises circuitry to couple the input of each of the capacitors to either the first reference voltage or the second reference voltage according to a respective bit of the digital input.

10. The digital-to-analog converter of claim 1 wherein the control circuitry to couple the output node to the first voltage source during the precharge interval and to decouple the output node from the first voltage source upon conclusion of the precharge interval comprises circuitry to couple the output node to the first voltage source in response to assertion of a first control signal and to decouple the output node from the first voltage source in response to deassertion of the first control signal, and wherein the control circuitry to couple the inputs of the capacitors of the first and second subsets to either the first reference voltage or the second reference voltage according to bits of the digital input comprises circuitry to couple the inputs of the capacitors of the first and second subsets to either the first reference voltage or the second reference voltage in response to assertion of a second control signal.

11. The digital-to-analog converter of claim 10 wherein the control circuitry comprises logic circuitry to generate at one of the first and second control signals from the other.

12. A method of operation within a digital-to-analog converter having an output node and capacitors with outputs coupled in common to the output node, the method comprising:
charging first and second subsets of the capacitors to respective first and second precharge
voltages during a precharge interval, including:
coupling the output node to a first voltage source,
coupling inputs of the capacitors of the first subset to a first reference voltage, and
coupling the inputs of the capacitors of the second subset to a second reference voltage;
decoupling the output node from the first voltage source upon conclusion of the precharge interval; and
after decoupling the output node from the first voltage source, coupling the inputs of the capacitors of the first and second subsets to either the first reference voltage or the second reference voltage according to bits of a digital input.

13. The method of claim 12 wherein decoupling the output node from the first voltage source comprises floating the output node to enable the first and second precharge voltages established across the capacitors of the first and second subsets to equalize at a third precharge voltage that falls between the first and second precharge voltages.

14. The method of claim 13 wherein respective quantities of the capacitors within the first and second subsets of the capacitors are constituted by equal quantities of the capacitors such that the third precharge voltage is the average of the first and second precharge voltages.

15. The method of claim 12 wherein:
the first voltage source is an analog signal having an amplitude indicated by the digital input and that swings, over time, between maximum and minimum voltage levels;
the first reference voltage exceeds the maximum voltage level of the analog signal; and
a voltage difference between the maximum and minimum voltage levels of the analog
signal substantially matches a voltage difference between the first and second reference voltages.

16. The method of claim 15 wherein the second reference voltage is a ground reference and wherein the maximum and minimum voltage levels of the analog signal are substantially equally offset from the ground reference in positive and negative polarities.

17. The method of claim 12 wherein coupling the inputs of the capacitors of the first and second subsets to either the first reference voltage or the second reference voltage according to bits of the digital input comprises coupling the inputs of each pair of the capacitors to either the first reference voltage or the second reference voltage according to a respective bit of the digital input.

18. The method of claim 12 wherein the digital input is constituted by an even number of bits equal in number to the total number of the capacitors having outputs coupled in common and wherein coupling the inputs of the capacitors of the first and second subsets to either the first reference voltage or the second reference voltage according to bits of the digital input comprises coupling the input of each of the capacitors to either the first reference voltage or the second reference voltage according to a respective bit of the digital input.

19. The method of claim 12 wherein coupling the output node to the first voltage source during the precharge interval and coupling the output node from the first voltage source upon conclusion of the precharge interval comprises coupling the output node to the first voltage source in response to assertion of a first control signal and decoupling the output node from the first voltage source in response to deassertion of the first control signal, and wherein coupling the inputs of the capacitors of the first and second subsets to either the first reference voltage or the second reference voltage according to bits of the digital input comprises coupling the inputs of the capacitors of the first and second subsets to either the first reference voltage or the second reference voltage in response to assertion of a second control signal.

20. An analog-to-digital converter (ADC) comprising:
a first ADC stage to generate a first digital value in response to a first analog signal;
a second ADC stage to generate a second digital value in response to a second analog signal; and
a digital-to-analog converter to generate the second analog signal on an output node coupled to the second ADC stage in response to the first digital value and the first analog signal, the digital-to-analog converter including:
capacitors having respective inputs and having outputs coupled in common to the output node; and
control circuitry to:
charge first and second subsets of the capacitors to respective first and second precharge voltages during a precharge interval by coupling the first analog signal to the output node, coupling the inputs of the capacitors of the first subset to a first reference voltage and coupling the inputs of the capacitors of the second subset to a second reference voltage;
decouple the first analog signal from the output node upon conclusion of the precharge interval; and
after decoupling the first analog signal from the output node, couple the inputs of the capacitors of the first and second subsets to either the first reference voltage or the second reference voltage according to bits of the first digital value to produce the second analog voltage on the output node.

* * * * *